United States Patent [19]

Mehta et al.

[11] Patent Number: 5,307,519
[45] Date of Patent: Apr. 26, 1994

[54] CIRCUIT WITH BUILT-IN HEAT SINK

[75] Inventors: Alay M. Mehta; Venus D. Desai, both of Plantation, Fla.

[73] Assignee: Motorola, Inc., Schaumburg, Ill.

[21] Appl. No.: 844,035

[22] Filed: Mar. 2, 1992

[51] Int. Cl.⁵ .................... H04B 1/16; H01M 10/50
[52] U.S. Cl. ........................ 455/343; 455/89;
361/704; 361/749; 361/794; 429/7; 429/120; 320/2
[58] Field of Search ............ 429/127, 7, 65, 121,
429/120, 93; 320/2; 257/712, 537, 717, 720, 747, 783, 792; 455/343, 89, 90; 174/252;
439/109; 361/395, 394, 397, 398, 412, 749, 704, 792, 794, 795; 428/138

[56] References Cited

U.S. PATENT DOCUMENTS

| | | | |
|---|---|---|---|
| 4,446,188 | 5/1984 | Patel et al. | 428/138 |
| 4,680,527 | 8/1986 | Benenati et al. | 429/93 |
| 4,924,291 | 5/1990 | Lesk et al. | 259/792 |
| 4,965,505 | 10/1990 | McCaleb et al. | 429/7 |
| 5,019,467 | 5/1991 | Fujiwara | 429/127 |
| 5,102,753 | 4/1992 | Rossoll et al. | 429/7 |
| 5,157,419 | 10/1992 | Matsumoto et al. | 257/537 |
| 5,180,645 | 1/1993 | Moré | 429/127 |

*Primary Examiner*—Reinhard J. Eisenzopf
*Assistant Examiner*—Lisa Charouel
*Attorney, Agent, or Firm*—Pedro P. Hernandez

[57] ABSTRACT

A circuit assembly (400) includes a flexible circuit (402) having first (504) and second layers (502). A current-limiting device such as a nichrome strip (316) is coupled to the flexible circuit (402) for limiting the amount of current during a short circuit condition. A heat sink (404) is selectively placed between the first and second layers of the flexible circuit in thermal proximity to the nichrome wire (316) in order to dissipate some of the heat generated by the nichrome strip (316).

12 Claims, 3 Drawing Sheets

CIRCUIT WITH BUILT-IN HEAT SINK

TECHNICAL FIELD

This invention relates generally to circuit carriers, and more specifically to flexible circuits used in batteries.

BACKGROUND

Batteries used with portable communication devices sometimes require the use of nichrome wire as a safety device in order to limit the amount of current flow in case of a short circuit. This is typically the case for batteries which need to meet safety level specifications (such as intrinsic safety standards) set by testing agencies such as Factory Mutual, etc. The nichrome wire acts as a current-limiting device similar to a resistor. Typically, batteries which meet these safety standards will also use a polyswitch (such as a positive temperature coefficient device (PTC) made by RAYCHEM, Inc.). Usually, the polyswitch will heat up and "trip" in a few seconds (approximately 3 to 4 seconds) after a short circuit condition occurs. In intrinsically safe batteries, however, given that the nichrome strip is connected in series (adding more resistance to the current flow during a short circuit) the polyswitch will normally take between 7-10 seconds. This increase in time causes more heat to be built-up at the nichrome strip (since the polyswitch takes longer to trip). Once activated, the polyswitch limits the amount of current flow and thereby reduces any chances of damage to the communication device and the battery. The nichrome strip is generally designed not to open electrically, and thereby tends to get extremely hot when short circuits develop. This heat can cause charring and damage to the battery. Since the polyswitch takes several seconds to activate, present intrinsically safe batteries will utilize a fiberglass or other heat absorbing material to incase the nichrome strip. This protects the battery from the heat that is generated by the nichrome wire during a short circuit condition. Unfortunately adding a sleeve or other thermal protector to the flexible circuit adds manufacturing expense which includes the cost of the fiberglass sleeve and the added labor required to manually insert the sleeve. A need thus exists for a way of dissipating some of the heat generated by the nichrome wire when a short circuit is created, thereby dispersing the concentration of heat and preventing any damage to the battery without having to incur additional manufacturing expenses.

SUMMARY OF THE INVENTION

Briefly, according to the invention, a circuit assembly comprises a circuit carrier having first and second layers. A current-limiting device is coupled to the circuit carrier and a heat sink is selectively placed between the first and second layers of the circuit carrier in thermal proximity to the current-limiting device.

In another aspect of the invention, a battery includes a battery cell and a circuit assembly coupled to the battery cell.

DETAILED DESCRIPTION OF THE PREFERRED EMBODIMENT

Figure 1:
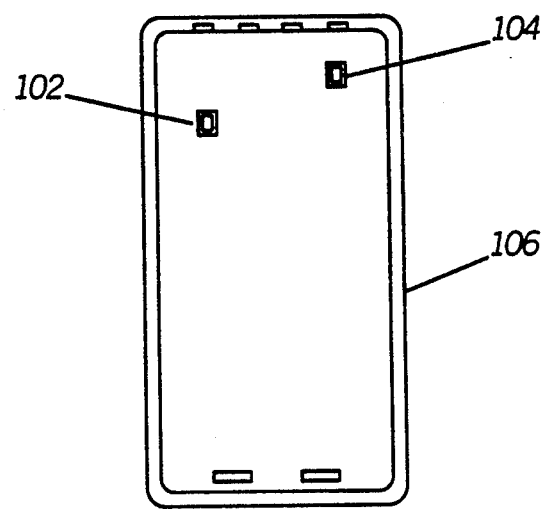
FIG. 1 is a front elevational view of a battery for use in a portable communication device in accordance with the present invention.

Referring now to the drawings and specifically to FIG. 1, there is shown a battery for use in a portable communication device in accordance with the invention. Battery is preferably a rechargeable battery such as a nickel-cadmium battery. Battery 100 includes a front battery housing 106 and negative 102 and positive 104 battery terminals. Battery terminals 102 and 104 are coupled to a portable battery operated device such as a portable radio.

Figure 2:
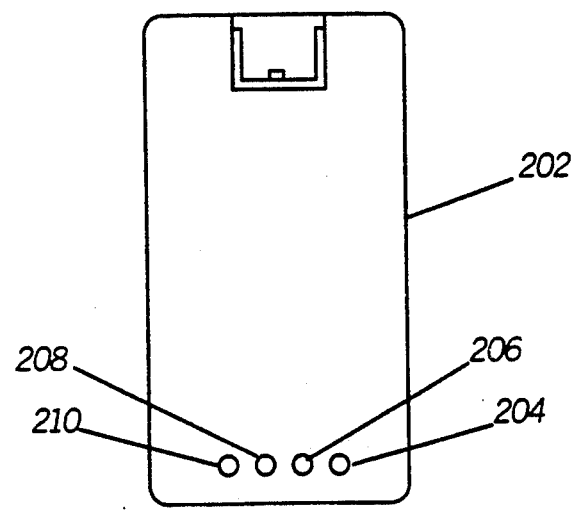
FIG. 2 is the back elevational view of the battery in FIG. 1.

In FIG. 2, there is shown a back elevational view of the battery of FIG. 1. A back housing member 202 and a plurality of charging terminals 204, 206, 208 and 210 are shown. Terminals 204, 206, 208 and 210 interface to a battery charger (not shown) whenever battery 100 is placed in a battery charger for charging.

Figure 3:
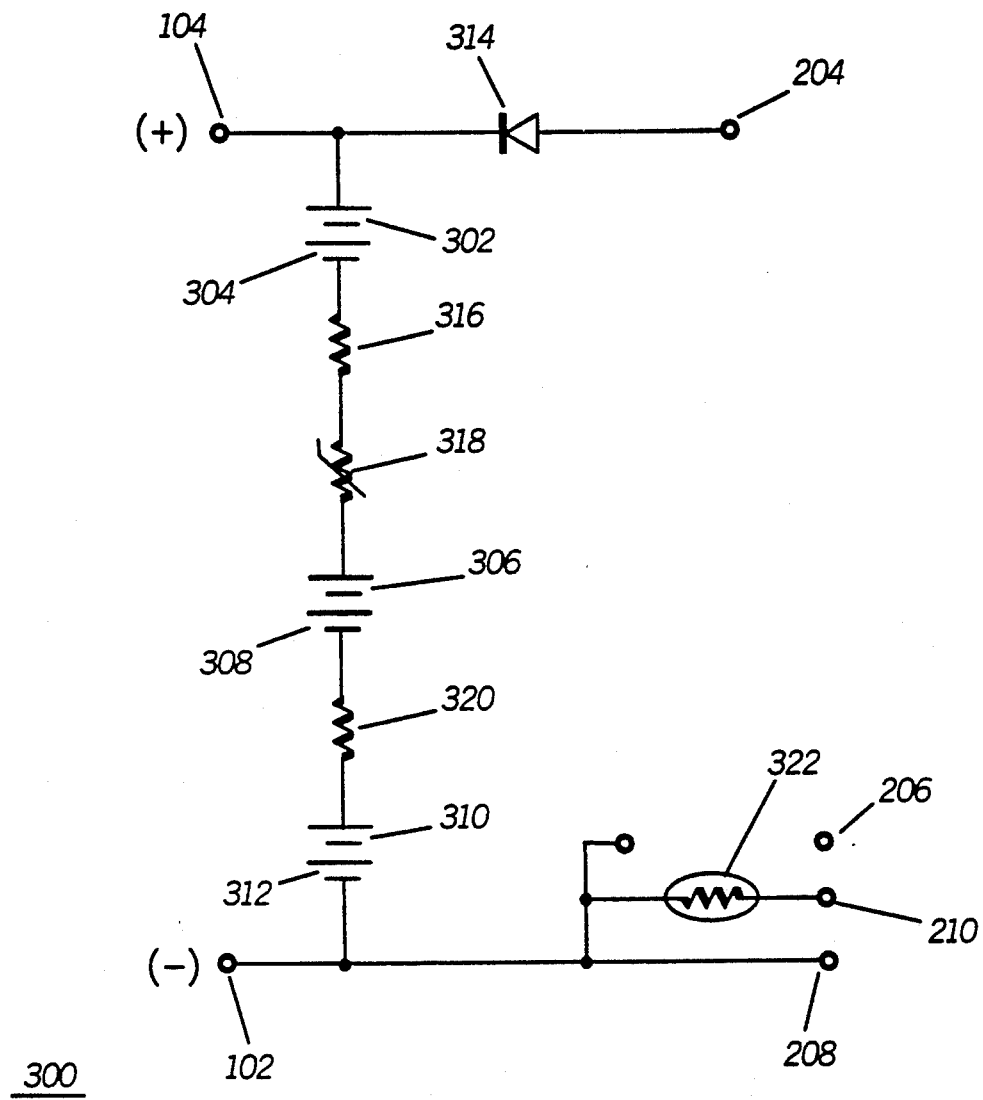
FIG. 3 is an electrical schematic of the battery of FIG. 1.

In FIG. 3 an electrical schematic of battery 100 is shown. Coupled to positive terminal 104 is a diode 314 having its anode coupled to the positive charger terminal 204. Coupled to the negative terminal of battery cell 304 is a current-limiting device such as a piece of nichrome wire 316. The main purpose of nichrome wire 316 is to limit current for compliance with Factory Mutual Approval standards (or other testing agency requirements) in case of a short circuit.

Coupled to nichrome wire 316 is a polyswitch 318 or positive temperature coefficient device, preferably made by RAYCHEM, Inc. Operationally, if the battery 300 suffered an external short between radio contacts 104 and 102, polyswitch 318 would heat up and trip, thereby limiting the amount of current flow several seconds (approximately 7-10 seconds) after the short (the amount of time to trip the polyswitch will depend on the state of charge of the battery cells, etc). The nichrome strips 316 and 320 would limit the current of the short until the polyswitch 318 activates. Nichrome strips 316 and 320 will get extremely hot for the time a short condition exits and the polyswitch has not tripped.

A second set of battery cells 306 and 308 are coupled to polyswitch 318 on the positive terminal and to a second nichrome strip 320 on the negative terminal. A third set of battery cells 310 and 320 are coupled between nichrome strip 320 and negative terminal 102.

Battery 300 also includes a thermistor 322 disposed between the negative charging terminal 208 and thermistor terminal 210. Thermistor 322 is used for determining the charge rate based on temperature as is known in the art. The unused terminal 206 can be utilized for determining what type of battery is being charged or for other similar functions as known in the art.

Figure 4:
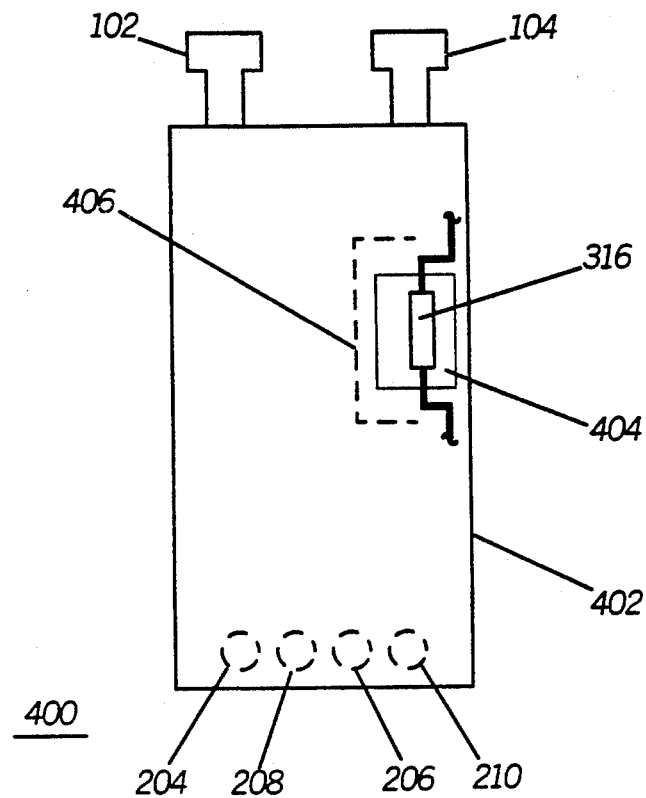
FIG. 4 is a drawing showing the flexible circuit used in the battery in FIG. 1 in accordance with the present invention.

In FIG. 4, there is shown a circuit carrier 400 such as a flexible circuit 402 ("flex" circuit) which is part of battery 100. Flexible circuit 402 is preferably manufactured from a polyimide such as KAPTON TM manufactured by Dupont, Inc, or other flexible materials used in the art. Although, preferably, the material chosen should withstand high temperatures without being charred or damaged. Flexible circuit 402 preferably consists of first and second layers of polyimide having the battery circuit runners sandwiched between the layers. The layers are connected using industry standard adhesives and manufacturing techniques. Coupled to the flexible circuit 402 are metal tabs forming the positive 104 and negative 102 battery terminals. Metal tabs are found on the reverse side of the flexible circuit 402 forming the charging terminal contacts 204, 206, 208 and 210.

Shown on flexible circuit 402 is the portion of the battery circuit which illustrates the present invention. Nichrome wire 316 is shown lying flat on flexible circuit 402 with a heat sink formed from etched copper 404 underneath the nichrome wire. The heat sink 404 is sandwiched between the flexible circuit board layers thereby being electrically insulated from the nichrome wire. Since the heat sink is etched from copper during the formation of the flexible circuit traces (runners), no additional expenses are incurred in forming heat sink 404. Typically, flexible circuits will range in thickness from 0.003 to 0.30 inch depending on the number of layers the flexible circuit may have. Each of the flexible circuit layers being approximately 0.002 inch thick with the copper etching lying between the layers and adhesive being dispersed between the layers for bonding the layers together.

The size of the copper heat sink 404 will depend on several factors such as the amount of heat required to be dissipated, which will depend on the amount of current flowing through the nichrome wire 316. Also, the distance from the copper heat sink 404 to the nichrome strip 316, and the type of material the flexible circuit is made from helps determine the size of copper to utilize in forming the heat sink.

Optionally, a section 406 of the flexible circuit 402 can be cut in order to allow for the cut section 406 to be folded over the nichrome strip 316, thereby substantially surrounding the nichrome strip 316. Since nichrome strip 316 is flat, very little added space is taken up by folding the cut section 406 of flexible circuit 402 over the nichrome strip 316.

Figure 5:
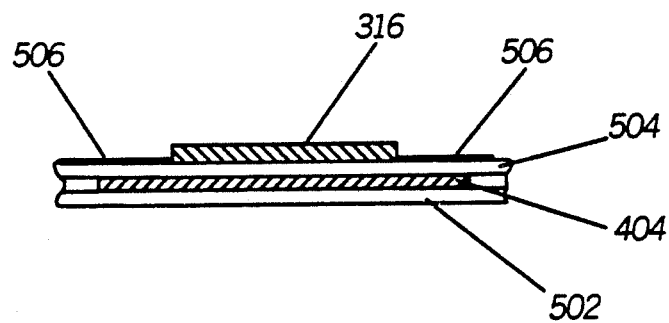
FIG. 5 is a partial cross-sectional view of the flexible circuit in accordance with the present invention.

In FIG. 5, a partial cross-sectional view of the flexible circuit in accordance with the present invention is shown. In this view the nichrome strip 316 is seen lying flush with the first flexible circuit layer 504. Heat sink 404 is shown sandwiched between the first (504) and second (502) polyimide layers which help form the flexible circuit. Conductive terminals 506 are coupled to the nichrome wire 316 at each side. Once past heat sink 404, conductive terminals 506 can be coupled to conductive traces found between the first (504) and second (502) layers of the flexible circuit utilizing conventional vias, as known in the art.

In the preferred embodiment, heat sink 404 will be in thermal proximity to nichrome strip 316. Thermal proximity being that the heat sink 404 is located close enough to the nichrome strip 316 to be able to dissipate some heat away from the nichrome strip 316. Preferably, heat sink 404 is approximately 0.002 inch (or closer) from nichrome strip 316. The closer heat sink 404 is to nichrome strip 316, the quicker heat will dissipate away from nichrome strip 316 via the heat sink.

Heat sink 404 can be an electrically-isolated section of etched copper, or an electrically-conductive section of flexible circuit 402 serving the dual purpose of electrical trace and heat sink. The shape of heat sink 404 will depend on the type of flexibility that will be required for flexible circuit 402, as well as the amount of thermal transfer required. Heat sink 404 can also be made by placing a thermally conductive material (such as a piece of metal) between the flex circuit layers although this would not be as preferable as etching the heat sink onto one of the flexible circuit layers.

Since in the preferred embodiment flexible circuit layers 502 and 504 are made from KAPTON TM (Dupont, Inc.), a material which can withstand a good amount of temperature build-up, very little problems such as charring of the flexible circuit will occur. When designing the heat sink 404, consideration as to the duration and amount of temperature to be realized under short-circuit conditions will have to be taken into consideration. Since a typical polyswitch will not activate for a few seconds, the temperature of nichrome strip 404 will rise very quickly requiring heat sink 404 to be able to disperse some of the heat which is concentrated in the small area comprising nichrome strip 316 away towards the larger heat sink area.

Figure 6:
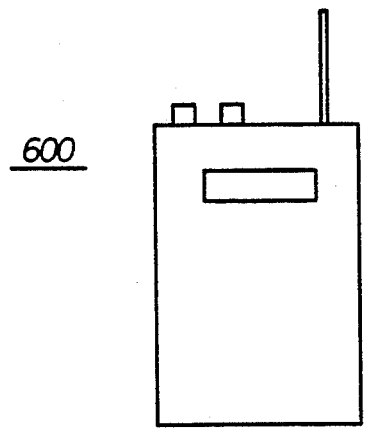
FIG. 6 is a front view of a communication device in accordance with the present invention.

In FIG. 6, there is shown a radio 600 in accordance with the invention. Radio 600 can be a frequency modulated radio having a transmitter and receiver which includes the circuit assembly of the present invention.

In summary, the present invention provides a simple and cost effective way of providing a heat sink in a multi-layer circuit. In battery applications where the circuit board flexibility is sometimes crucial, due to packaging issues, the present invention provides for an easy way of implementing a flexible heat sink. Although the preferred embodiment has been shown in a flexible circuit, a circuit assembly such as a molded circuit where the heat sink is placed between molded layers, printed circuit boards, or other similar circuit carriers can benefit from the present invention. Since in the preferred embodiment the heat sink 404 is formed during the circuit trace etching process, no added expense is incurred in its creation.

What is claimed is:

1. A circuit assembly, comprising:
   a flexible circuit carrier having first and second layers, each of the first and second layers formed of a same material;
   a current-limiting device coupled to the flexible circuit carrier;
   a heat sink placed between the first and second layers of the circuit carrier in thermal proximity to the current-limiting device; and
   the flexible circuit carrier has a section cut surrounding the current-limiting device so that a portion of the flexible circuit carrier is folded over the current-limiting device.

2. A circuit assembly, as defined in claim 1, wherein the heat sink is formed from a portion of copper which is etched to the flexible circuit carrier.

3. A circuit assembly, as defined in claim 1, wherein the heat sink comprises copper.

4. A circuit assembly, as defined in claim 3, wherein the first and second layers of the flexible circuit carrier are formed from a polyimide.

5. A circuit assembly, comprising:
   a flexible circuit carrier having first and second layers;
   nichrome wire coupled to the flexible circuit carrier;

a heat sink placed between the first and second layers of the flexible circuit carrier in thermal proximity to the nichrome wire; and the flexible circuit carrier has a section cut surrounding the nichrome wire so that a portion of the flexible circuit carrier is folded over the nichrome wire.

6. A circuit assembly, as defined in claim 5, wherein the heat sink comprises copper.

7. A battery, comprising:
   at least one battery cell; and
   a circuit assembly coupled to the at least one battery cell, the circuit assembly comprising;
      a flexible circuit carrier having first and second layers coupled to the at least one battery cell;
      a current-limiting device coupled to the flexible circuit carrier;
      a heat sink placed between the first and second layers of the flexible circuit carrier in thermal proximity to the current-limiting device; and
      the flexible circuit carrier has a section cut surrounding the current-limiting device so that a portion of the flexible circuit carrier is folded over the current-limiting device.

8. A battery, as defined in claim 7, wherein the heat sink is formed from a portion of copper which has been etched to the flexible circuit carrier.

9. A battery, comprising:
   at least one battery cell; and
   a circuit assembly coupled to the at least one battery cell, the circuit assembly comprising;
      a flexible circuit carrier having first and second layers coupled to the at least one battery cell;
      a piece of nichrome wire coupled to the flexible circuit carrier; and
      a heat sink placed between the first and second layers of the flexible circuit carrier in thermal proximity to the piece of nichrome wire; and the flexible circuit carrier has a section cut surrounding the nichrome wire so that a portion of the flexible circuit carrier is folded over the nichrome wire.

10. A radio, comprising:
    a receiver; and
    a battery coupled to the receiver, the battery including;
       at least one battery cell;
       a flexible circuit carrier having first and second layers coupled to the at least one battery cell;
       a current-limiting device coupled to the flexible circuit carrier;
       a heat sink placed between the first and second layers of the flexible circuit carrier in thermal proximity to the current-limiting device; and
       the flexible circuit carrier has a section cut surrounding the current-limiting device so that a portion of the flexible circuit carrier is folded over the current-limiting device.

11. A radio, as defined in claim 10, wherein the current-limiting device comprises a piece of nichrome wire.

12. A radio, as defined in claim 11, wherein the heat sink comprises a piece of copper which has been etched to the flexible circuit carrier.

* * * * *